(12) United States Patent
Arai

(10) Patent No.: US 10,498,360 B2
(45) Date of Patent: Dec. 3, 2019

(54) DATA TRANSMITTER

(71) Applicant: NEC Corporation, Minato-ku, Tokyo (JP)

(72) Inventor: Masahiro Arai, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/883,252

(22) Filed: Jan. 30, 2018

(65) Prior Publication Data

US 2018/0287631 A1 Oct. 4, 2018

(30) Foreign Application Priority Data

Mar. 28, 2017 (JP) .................................. 2017-062788

(51) Int. Cl.
| | |
|---|---|
| *H03M 13/00* | (2006.01) |
| *H03M 13/09* | (2006.01) |
| *H04J 3/22* | (2006.01) |
| *H03M 5/00* | (2006.01) |
| *H03M 5/14* | (2006.01) |
| *H03M 7/14* | (2006.01) |
| *H04L 25/49* | (2006.01) |
| *H04L 1/00* | (2006.01) |

(52) U.S. Cl.
CPC ............. *H03M 13/09* (2013.01); *H03M 5/00* (2013.01); *H03M 5/145* (2013.01); *H03M 7/14* (2013.01); *H04J 3/22* (2013.01); *H04L 25/4908* (2013.01); *H04L 1/0041* (2013.01); *H04L 1/0061* (2013.01)

(58) Field of Classification Search
CPC ......... H03M 13/09; H04J 3/22; H04L 1/0061; H04L 1/0041
See application file for complete search history.

(56) References Cited

U.S. PATENT DOCUMENTS 5,081,619 A * 1/1992 Nagata .................... H04J 3/073
370/217
2009/0034964 A1 2/2009 Sakai et al.

FOREIGN PATENT DOCUMENTS

| JP | S62-253251 A | 11/1987 |
|---|---|---|
| JP | H04-058647 A | 2/1992 |
| JP | H07-030510 A | 1/1995 |
| JP | H08-097792 A | 4/1996 |
| JP | 2000-124929 A | 4/2000 |
| JP | 2001-127799 A | 5/2001 |
| JP | 2009-016925 A | 1/2009 |

OTHER PUBLICATIONS

Japanese Office Action for JP Application No. 2017-062788 dated May 29, 2018 with English Translation.

* cited by examiner

*Primary Examiner* — Samir W Rizk

(57) ABSTRACT

A data transmitter includes an encoder configured to encode first data to be transmitted, in accordance with an encoding rule and a transmitter configured to transmit the encoded first data. The encoder makes a change to the encoding rule, encodes the first data in accordance with the change in the encoding rule, and incorporates second data having content corresponding to the change in the encoding rule, into the first data.

20 Claims, 7 Drawing Sheets

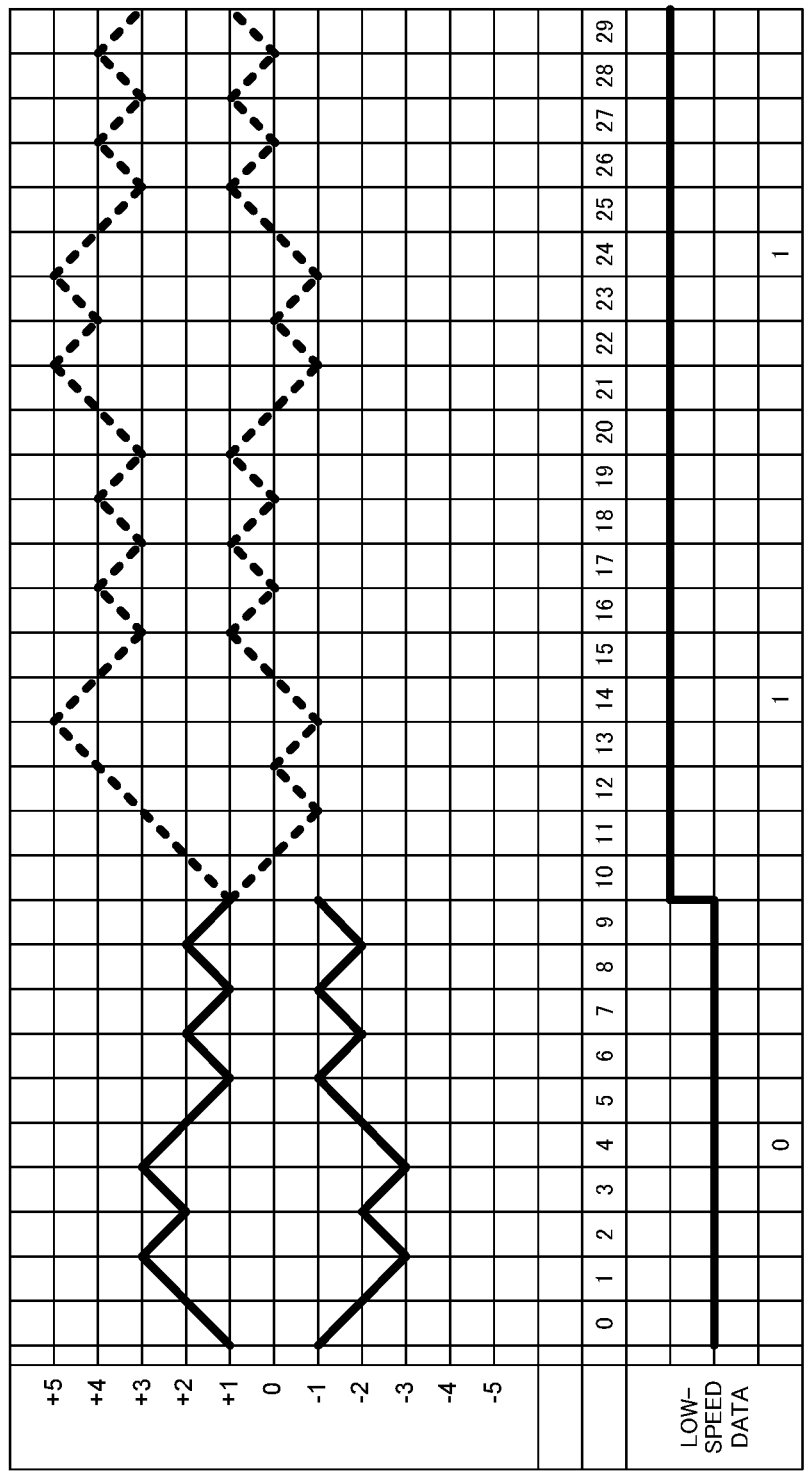

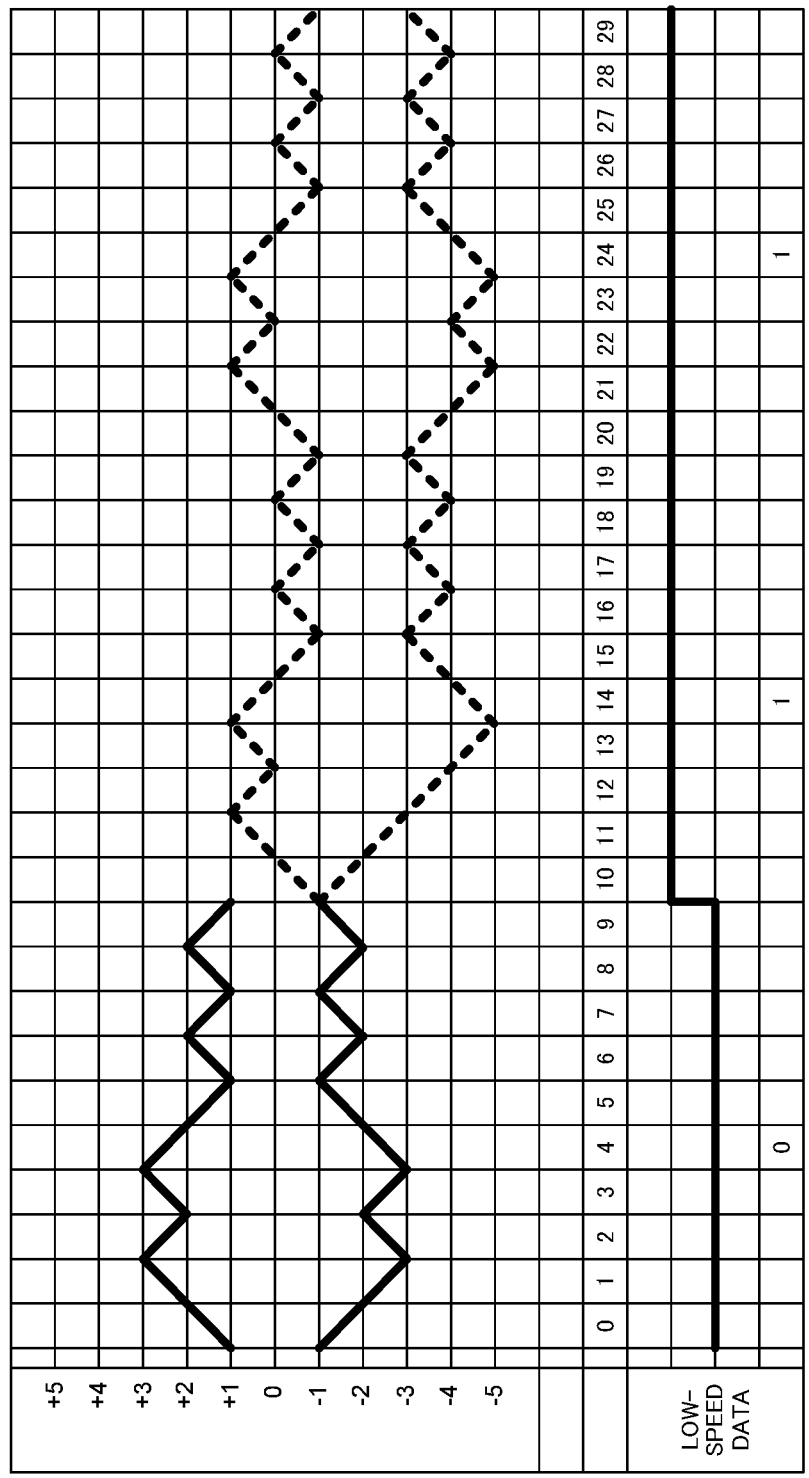

DATA TRANSMITTER

INCORPORATION BY REFERENCE

The present invention is based upon and claims the benefit of priority from Japanese patent application No. 2017-062788, filed on Mar. 28, 2017, the disclosure of which is incorporated herein in its entirety by reference.

TECHNICAL FIELD

The present invention relates to a data transmitter and, in particular, to a data transmitter that transmits two types of data through the same transmission path.

BACKGROUND ART

In addition to primary data to be transmitted from a transmitter to a receiver, for example, data desired by the receiver, such as a transmission error detected by the transmitter or the state of the transmitter, may need to be transmitted. The primary data to be transmitted needs to be transmitted at high speed, and such data will be hereafter referred to as "high-speed data." On the other hand, other data does not need to be transmitted at high speed and can be transmitted at lower speed than the high-speed data, and such data will be hereafter referred to as "low-speed data."

Consider two independent devices 1, 2 between which high-speed data is transmitted as described above. If low-speed data which is information about the state of the device 1 is transmitted from the device 1 to the device 2 in this configuration, two typical methods below are conceivable.

A first method is to provide a transmission medium L1 for transmitting data and another transmission medium L2 for transmitting information about the state of the device, as shown in FIG. 1. In this method, the medium for transmitting data and the medium for transmitting information about the state of the device are independent of each other and therefore information about the state of the device can be transmitted without blocking data transmission.

A second method is to transmit information about the state of the device through a data transmission medium L1, as shown in FIG. 2. As shown in FIG. 3, this method involves transmitting primary data to be transmitted, which is high-speed data, and information about the state of the device, which is low-speed data, in a time-sharing manner. Methods for transmitting multiple types of data using a time-sharing technique are described in, for example, Patent Documents 1, 2, 3.

Patent Document 1: Japanese Unexamined Patent Application Publication No. 2009-016925
Patent Document 2: Japanese Unexamined Patent Application Publication No. 2001-127799
Patent Document 3: Japanese Unexamined Patent Application Publication No. 2000-124929

SUMMARY OF THE INVENTION

Unfortunately, the first method needs to provide a dedicated transmission medium for transmitting information about the state of the device, causing a problem that the equipment cost is increased. The second method involves transmitting data in a time-sharing manner, causing a problem that the transmission efficiency of high-speed data is reduced.

The problem associated with the second method can occur not only when pieces of data having content as described above are transmitted but also when multiple pieces of data of any types are transmitted through the same transmission path.

Accordingly, an object of the present invention is to solve the above problems, that is, the increase in equipment cost and the reduction in data transmission efficiency associated with the transmission of multiple pieces of data.

A data transmitter according to one aspect of the present invention includes:

an encoder configured to encode first data to be transmitted, in accordance with an encoding rule; and a transmitter configured to transmit the encoded first data.

The encoder makes a change to the encoding rule, encodes the first data in accordance with the change in the encoding rule, and incorporates second data having content corresponding to the change in the encoding rule, into the first data.

A data receiver according to one aspect of the present invention includes:

a receiver configured to receive first data encoded in accordance with an encoding rule; and a decoder configured to decode the first data in accordance with the encoding rule.

If a change is made to the encoding rule in encoding the first data, the decoder detects the change in the encoding rule by decoding the first data and reads second data having content corresponding to the change in the encoding rule.

A communication system according to one aspect of the present invention is a communication system including a data transmitter and a data receiver.

The data transmitter includes:

an encoder configured to encode first data to be transmitted, in accordance with an encoding rule; and a transmitter configured to transmit the encoded first data.

The encoder makes a change to the encoding rule, encodes the first data in accordance with the change in the encoding rule, and incorporates second data having content corresponding to the change in the encoding rule, into the first data.

The data receiver includes:

a receiver configured to receive the first data encoded in accordance with the encoding rule; and a decoder configured to decode the first data in accordance with the encoding rule.

If a change is made to the encoding rule in encoding the first data, the decoder detects the change in the encoding rule by decoding the first data and reads second data having content corresponding to the change in the encoding rule.

A data transmission method according to one aspect of the present invention includes:

encoding, by a data transmitter, first data to be transmitted, in accordance with an encoding rule; and transmitting, by the data transmitter, the encoded first data.

The data transmitter makes a change to the encoding rule, encodes the first data in accordance with the change in the encoding rule, and incorporates second data having content corresponding to the change in the encoding rule, into the first data.

A data receiving method according to one aspect of the present invention includes:

receiving, by a data receiver, first data encoded in accordance with an encoding rule; and decoding, by the data receiver, the first data in accordance with the encoding rule.

If a change is made to the encoding rule in encoding the first data, the data receiver detects the change in the encoding rule by decoding the first data and reads second data having content corresponding to the change in the encoding rule.

A data transmission/reception method according to one aspect of the present invention is a data transmission/reception method performed by a communication system including a data transmitter and a data receiver.

The method includes:

encoding, by a data transmitter, first data to be transmitted, in accordance with an encoding rule;

transmitting, by the data transmitter, the encoded first data, wherein the data transmitter makes a change to the encoding rule, encodes the first data in accordance with the change in the encoding rule, and incorporates second data having content corresponding to the change in the encoding rule, into the first data;

receiving, by a data receiver, the first data encoded in accordance with the encoding rule; and decoding, by the data receiver, the first data in accordance with the encoding rule, wherein if a change is made to the encoding rule in encoding the first data, the data receiver detects the change in the encoding rule by decoding the first data and reads second data having content corresponding to the change in the encoding rule.

A program according to one aspect of the present invention causes a data transmitter to implement:

an encoder configured to encode first data to be transmitted, in accordance with an encoding rule; and a transmitter configured to transmit the encoded first data.

The encoder makes a change to the encoding rule, encodes the first data in accordance with the change in the encoding rule, and incorporates second data having content corresponding to the change in the encoding rule, into the first data.

A program according to one aspect of the present invention causes a data receiver to implement:

a receiver configured to receive first data encoded in accordance with an encoding rule; and a decoder configured to decode the first data in accordance with the encoding rule.

If a change is made to the encoding rule in encoding the first data, the decoder detects the change in the encoding rule by decoding the first data and reads second data having content corresponding to the change in the encoding rule.

According to the above configurations of the present invention, it is possible to suppress the increase in equipment cost and the reduction in data transmission efficiency associated with the transmission of multiple pieces of data.

BRIEF DESCRIPTION OF DRAWINGS

FIG. 7A is a diagram showing encoding of transmission data;

FIG. 7B is a diagram showing encoding of transmission data;

EXEMPLARY EMBODIMENT

First Embodiment

Figure 1:
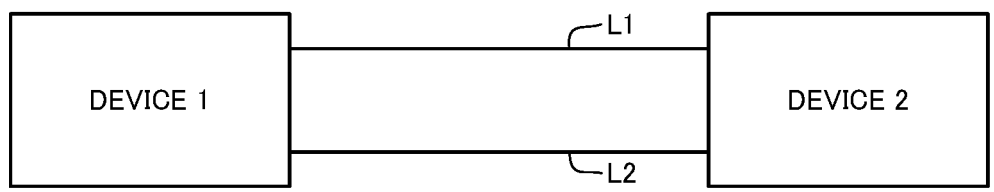
FIG. 1 is a diagram showing the configuration of a communication system for describing the background of the present invention.
Figure 2:
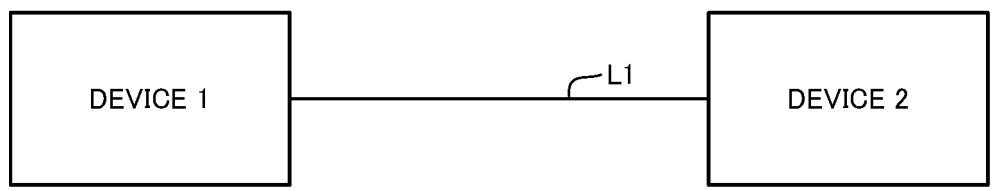
FIG. 2 is a diagram showing the configuration of a communication system for describing the background of the present invention.
Figure 3:
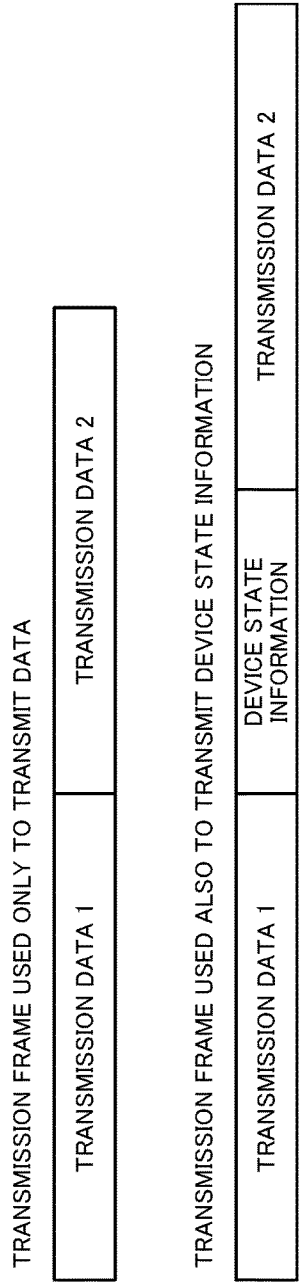
FIG. 3 is a diagram showing the structure of a transmission frame of the communication system shown in FIG. 2.
Figure 4:
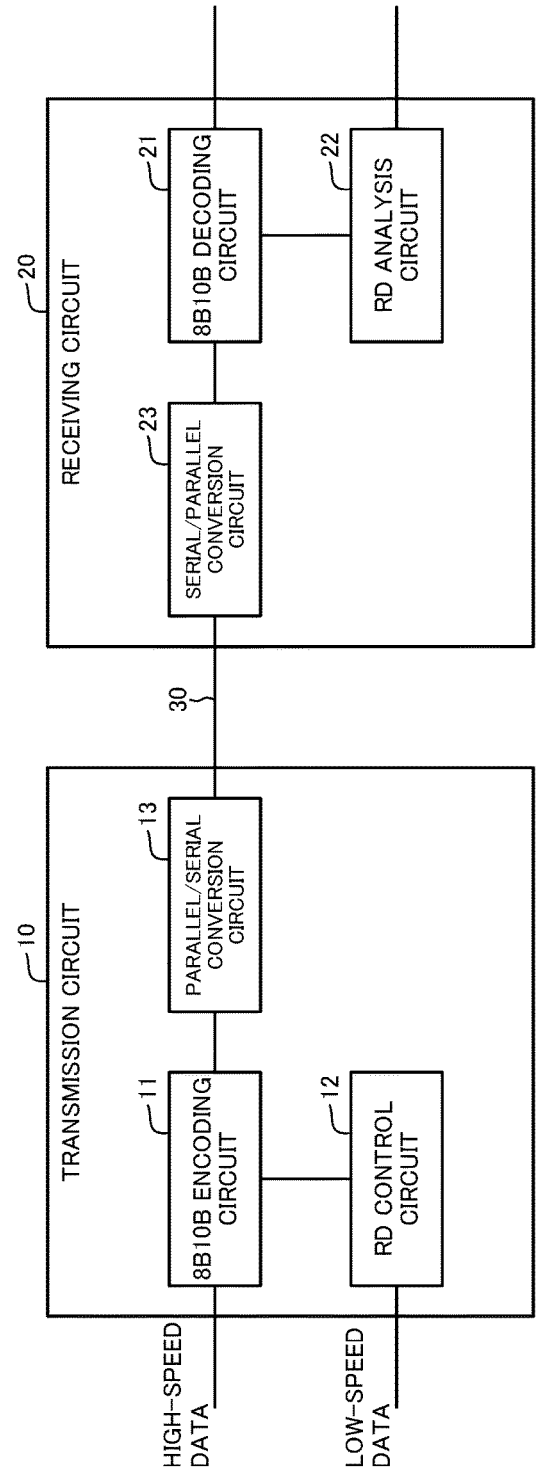
FIG. 4 is a block diagram showing the configuration of a communication system according to a first embodiment of the present invention.

A first embodiment of the present invention will be described with reference to FIGS. 4 to 8B. FIG. 4 is a diagram showing the configuration of a communication system according to the present embodiment. FIGS. 5 to 8B are diagrams showing encoding of transmission data according to the present embodiment.

Configuration

As shown in FIG. 4, the communication system according to the present embodiment includes a transmission circuit 10 included in a data transmitter and a receiving circuit 20 included in a data receiver and connected to the transmission circuit 10 through a data transmission medium 30.

In the present embodiment, high-speed data (first data) and low-speed data (second data) are simultaneously transmitted from the transmission circuit 10 to the receiving circuit 20 through the single data transmission medium 30. For example, the high-speed data is primary data to be transmitted from the transmission circuit 10 and is data required to be transmitted at high-speed. For example, the low-speed data is data such as information about the state of the data transmitter including the transmission circuit 10 and is data that is allowed to be transmitted at lower speed than the high-speed data. However, the high-speed data and low-speed data need not necessarily have the content described above, and the relative transmission speeds need not be those described above.

In the present embodiment, it is assumed that the high-speed data is encoded in accordance with the 8B10B encoding rules and then transmitted. The 8B10B encoding rules are described below.

8B10B encoding is an encoding scheme for expanding 8-bit data into preset 10-bit symbol data for transmission. The expansion of 8 bits into 10 bits has a disadvantage that the transmission efficiency is reduced; however, 8B10B encoding achieves DC (direct current)-balance and improves the data transmission quality by controlling the incidence of 0s and 1s constituting the bits to 50% and limiting the number of consecutive 0s or 1s.

A method for controlling the incidence of 0s and 1s constituting the bits in 8B10B encoding is described below. In 8B10B encoding, the incidence of 0s and 1s constituting the data is controlled according to an encoding rule called "running disparity" (RD). One-code 10-bit data is divided into 6 bits and 4 bits. In each of 6 bits and 4 bits, a weight of +1 is assigned to each data value 1 and a weight of −1 is assigned to each data value 0 so that the sum of weights always is +2, 0, or −2 in each of 6 bits and 4 bits. As is understood from this RD calculation method, RD=+2 means that the number of 1s included in the bits is greater than the number of 0s included in the bits by 2; RD=0 means that the number of 1s and the number of 0s are the same; and RD=−2 means that the number of 0s is greater than the number of 1s by 2.

Examples of RD in 6-bit data are described below.
110101→RD=+2 (four 1s and two 0s and therefore the sum of the weights is +1×4−1×2=+2)
011000→RD=−2
010101→RD=0

The RD value is calculated for each 6-bit/4-bit data and updated.

In 8B10B encoding, two patterns, a pattern whose RD is 0 or −2, and a pattern whose RD is 0 or +2, are prepared for one 10-bit pattern, and either pattern can be selected.

Figure 5:
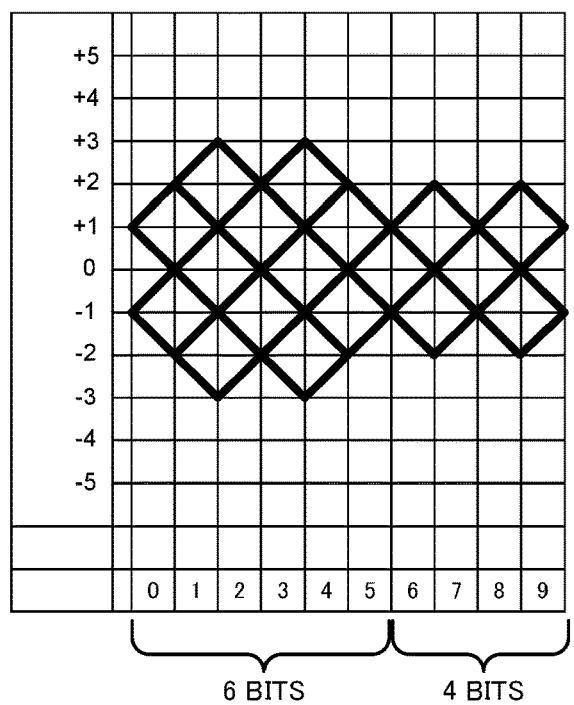
FIG. 5 is a graph showing encoding of transmission data.

Assume that RD is −1 at the start of transmission. The starting RD of −1 means that the number of 0s is greater than the number of 1s in the previously transmitted data. To maintain the DC balance of transmission data, a data pattern to be transmitted next must be a data pattern where the number of 1s is greater or data pattern where the number of 0s and the number of 1s are the same. If a data pattern where the number of 0s is greater is transmitted, the DC balance would be lost. Actually, if the previous RD is −1, data whose RD value is 0 or +2 is transmitted as the next pattern. Thus, after transmitting the data, the RD value becomes −1 or +1. Similarly, if the previous RD is +1, data whose RD value is 0 or −2 is transmitted as the next pattern. Thus, after transmitting the data, the RD value becomes −1 or +1. By repeating this, the RD value becomes −1 or +1 at the boundary between 6-bit data and 4-bit data FIG. 5 is a graph showing changes in RD in serial data that has been 8B10B-encoded for transmission. The horizontal axis represents the bit array of the serial data, and the vertical axis represents the RD value. The graph shows two pieces of 8B10B-encoded 10-bit data. Growing lines represent data 1, and decreasing lines represent data 0. Each data makes a transition on the lines shown in the graph. The RD value is always −1 or +1 at the boundary of 6 bits and 4 bits. The minimum RD value is −3, and the maximum RD value is +3. As shown by arrows in the graph, consecutive is are shown by the straight growing lines and are allowed to extend over up to 5 bits. Similarly, consecutive 0s are shown by the straight decreasing lines and are allowed to extend over 5 bits.

As seen above, according to an 8B10B encoding calculation rule, RD (calculation value) is set within a range of −3 to +3 and is −1 or +1 at the boundary between 6 bits and 4 bits. Also, according to an 8B10B encoding rule, identical signals (1s or 0s) are allowed to extend over up to 5 bits. In other words, consecutive identical signals are not allowed to extend over 6 (a predetermined number of) bits or more.

In the present invention, these 8B10B encoding rules are noted, and low-speed data corresponding to changes in the 8B10B encoding rules is incorporated into high-speed data and then transmitted. Specifically, RD is noted, and low-speed data is transmitted by setting the RD value to a value other than −1 and +1 at the boundary between 6 bits and 4 bits. For example, if the RD value is −1 or +1 at the boundary between 6 bits and 4 bits, low-speed data 0 is transmitted: if the RD value is other than −1 and +1 at the boundary between 6 bits and 4 bits, low-speed data 1 is transmitted. As seen above, by handling the change in the RD value as a flag indicating the change in the low-speed data, the low-speed data can be transmitted through the transmission medium through which high-speed data is being transmitted.

The configuration of the transmission circuit 10 and receiving circuit 20 will be described in more detail. As shown in FIG. 4, the transmission circuit 10 includes an 8B10B encoding circuit 11, an RD control circuit 12, and a parallel/serial conversion circuit 13. The receiving circuit 20 includes an 8B10B decoding circuit 21, an RD analysis circuit 22, and a serial/parallel conversion circuit 23. Function units that perform the same processes as those performed by these circuits may be constructed by causing arithmetic devices to execute programs. That is, the transmission circuit 10 and receiving circuit 20 may be information processing devices including arithmetic devices, or the functions of the circuits 11 to 13, 21 to 23 may be constructed by causing arithmetic devices to execute programs.

The 8B10B encoding circuit 11 (encoder) encodes high-speed data inputted to the transmission circuit 10 in accordance with the 8B10B encoding rules. The 8B10B encoding circuit 11 also changes the RD value in accordance with low-speed data so that the RD value differs from the RD value according to the 8B10B encoding rules. The 8B10B encoding circuit 11 then outputs the encoded high-speed data to the parallel/serial conversion circuit 13.

The RD control circuit 12 (encoder) receives low-speed data and causes the 8B10B encoding circuit 11 to change the RD value at the boundary between 6 bits and 4 bits on the basis of whether the received low-speed data is 0 or 1. That is, the RD control circuit 12 makes changes to the 8B10B encoding rules in accordance with the low-speed data, controls the RD value in accordance with the changes in the 8B10B encoding rules, and causes the 8B10B encoding circuit 11 to incorporate the low-speed data into the high-speed data during encoding.

The parallel/serial conversion circuit 13 (transmitter) converts the encoded high-speed data outputted from the 8B10B encoding circuit 11 into serial data and transmits it to the receiving circuit 20 through the data transmission medium 30.

The serial/parallel conversion circuit 23 (receiver) receives the serial data transmitted from the transmission circuit 10 through the data transmission medium 30 and converts the serial data into parallel data. Thus, the serial/parallel conversion circuit 23 outputs the same high-speed data as the high-speed data inputted to the parallel/serial conversion circuit 13 of the transmission circuit 10, to the 8B10B decoding circuit 21.

The 8B10B decoding circuit 21 (decoder) decodes the high-speed data in accordance with the 8B10B encoding rules and outputs the decoded high-speed data. Note that during decoding, the 8B10B decoding circuit 21 detects an RD value at the boundary between 6 bits and 4 bits different from that according to the 8B10B encoding rules. The 8B10B decoding circuit 21 then inputs the detected RD value to the RD analysis circuit 22.

The RD analysis circuit 22 (decoder) checks the RD value detected by the 8B10B decoding circuit 21 and detects and outputs the value of the low-speed data included in the transmitted high-speed data.

Operation

Next, the operation of the transmission circuit 10 and receiving circuit 20 will be described. As described above, it is assumed that high-speed data and low-speed data are transmitted through the single data transmission medium 30. It is also assumed that the initial value of the low-speed data to be transmitted is 0; 1 bit of the low-speed data corresponds to n bytes of the high-speed data; 1 byte of the high-speed data is 8 bits, which is 1 unit in 8B10B encoding; and a switch between 0 and 1 in the low-speed data synchronizes 1 byte of the high-speed data.

First, the operation in the initial state of transmission will be described. It is assumed that the low-speed data is 0 in the initial state of transmission, and the state in which the low-speed data does not change from 0, which is represents the initial state, is defined as the initial state.

The high-speed data to be transmitted is inputted to the 8B10B encoding circuit 11 of the transmission circuit 10. The 8B10B encoding circuit 11 encodes the high-speed data in accordance with the 8B10B encoding rules.

The low-speed data to be transmitted, which is the initial value 0, is inputted to the RD control circuit 12. The RD control circuit 12 recognizes that the inputted low-speed data is 0, which represents the initial state. In this case, the RD control circuit 12 makes no instruction to the 8B10B encoding circuit 11. Thus, the 8B10B encoding circuit 11 encodes the high-speed data in accordance with the 8B10B encoding rules.

The encoded high-speed data outputted from the 8B10B encoding circuit 11 is inputted to the parallel/serial conversion circuit 13 and converted into serial data. The serial data is transmitted to the receiving circuit 20 through the data transmission medium 30.

In the receiving circuit 20, the received high-speed data is inputted to the serial/parallel conversion circuit 23, which then converts the serial high-speed data into parallel high-speed data.

The high-speed data outputted from the serial/parallel conversion circuit 23 is inputted to the 8B10B decoding circuit 21. The 8B10B decoding circuit 21 decodes the inputted high-speed data in accordance with the 8B10B encoding rules. At this time, the 8B10B decoding circuit 21 outputs the RD value at the boundary between 6 bits and 4 bits in the high-speed data to the RD analysis circuit 22.

The RD analysis circuit 22 recognizes that the transmission is in the initial state, because the RD value has not been other than −1 and +1 since the start of data transmission, and makes no instruction to the 8B10B decoding circuit 21. The RD analysis circuit 22 outputs 0 as low-speed data. The 8B10B decoding circuit 21 handles RD in accordance with the 8B10B encoding rules, since it has received no instruction from the RD analysis circuit 22, and outputs the decoded high-speed data.

Figure 6:
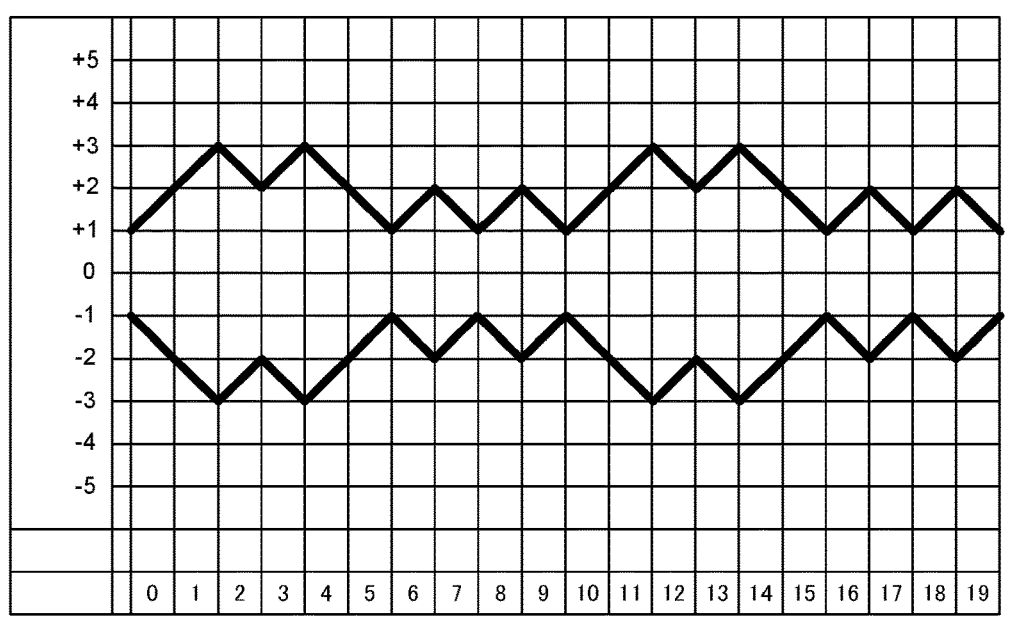
FIG. 6 is a graph showing encoding of transmission data.

FIG. 6 is a graph showing the range of RD in data passing through the data transmission medium 30 in the initial state of transmission. The horizontal axis represents the bit array of serial data, and the vertical axis represents the RD value. FIG. 6 is a graph obtained by extracting outer edge lines from the graph shown in FIG. 5 in order to know changes in the maximum and minimum values of RD. FIG. 6 shows two pieces of 8B10B-encoded 10-bit data. Since RD repeatedly changes on a bit-by-bit basis, similar waveforms are repeatedly formed by the third data and later. As in FIG. 5, RD makes a transition between +3 and −3 in the initial state. The RD value is −1 or +1 at the boundary between 6 bits and 4 bits in each 8B10B-encoded 10-bit data. Consecutive 0s or 1s are allowed to extend over up to 5 bits.

Next, the operation when the low-speed data is changed from 0 to 1 will be described. When the low-speed data is changed from 0 to 1, the RD control circuit 12 detects that the low-speed data has been changed from 0 to 1. The RD control circuit 12 then instructs the 8B10B encoding circuit 11 to invert the RD value at the boundary between 6 bits and 4 bits. The term "invert the RD value" refers to replacing the normal RD value −1 or +1 at the boundary between 6 bits and 4 bits with +1 or −1, respectively.

For example, if RD at the boundary between 6 bits and 4 bits is +1, RD is changed to −1, and data whose RD value is 0 or +2 is selected as next transmission data. Due to this control, the RD value at the boundary between 6 bits and 4 bits becomes +1 or +3. That is, if RD at the boundary between 6 bits and 4 bits is +1 in the initial state, data whose RD value is 0 or −2 is normally selected as next transmission data; however, data whose RD value is 0 or +2 is selected as next transmission data in response to the change in the low-speed data. By changing the encoding rules in this manner, the range of the RD value is changed.

Similarly, if RD at the boundary between 6 bits and 4 bits is −1, RD is changed to +1, and data whose RD value is 0 or −2 is selected as next transmission data. Due to this control, the RD value at the boundary between 6 bits and 4 bits becomes −1 or −3. That is, if RD at the boundary between 6 bits and 4 bits is −1 in the initial state, data whose RD value is 0 or +2 is normally selected as next transmission data; however, data whose RD is 0 or −2 is selected as next transmission data in response to the change in the low-speed data. By changing the encoding rules in this manner, the range of the RD value is changed. Note that RD is inverted as described above only if the low-speed data is changed from 0 to 1; RD is not inverted unless the low-speed data is changed.

The data outputted from the 8B10B encoding circuit 11 is transmitted to the receiving circuit 20 through the parallel/serial conversion circuit 13 and data transmission medium 30 and then inputted to the 8B10B decoding circuit 21 through the serial/parallel conversion circuit 23.

The 8B10B decoding circuit 21 outputs the RD value at the boundary between 6 bits and 4 bits to the RD analysis circuit 22. The RD value at the boundary between 6 bits and 4 bits is +1 or +3, or, −1 or −3. If the RD analysis circuit 22 detects that the RD value is +3 or −3, it determines that this value is a value that does not occur in normal 8B10B encoding and that RD has been inverted due to the change of the low-speed data from 0 to 1, and then outputs 1 as low-speed data. Note that if the RD value is −1 or +1, the RD analysis circuit 22 cannot determine whether RD has been inverted on the transmission side, since this value is a value that occurs in normal 8B10B encoding. It may take time for the RD analysis circuit 22 to detect that the RD value is +3 or −3. One measure to detect that the RD value is +3 or −3 due to the inversion of RD is to sufficiently increase the value of the byte number n of the high-speed data that defines 1 bit of the low-speed data.

When the RD analysis circuit 22 detects that low-speed data 1 has been transmitted, on the basis of the RD value and notifies the 8B10B decoding circuit 21 that RD has been inverted on the transmission side. Since the RD value of +3 or −3 at the boundary between 6 bits and 4 bits violates the 8B10B encoding rules, the 8B10B decoding circuit 21 normally attempts to raise an error. However, the 8B10B decoding circuit 21 has been notified of the inversion of RD by the RD analysis circuit 22 and therefore allows the RD value of +3 or −3 and performs control such that such an RD value is not handled as an error. That is, the 8B10B decoding circuit 21 8B10B-decodes the high-speed data considering the change in RD and outputs the decoded high-speed data.

FIGS. 7A, 7B are graphs showing examples of the range of RD in data passing through the data transmission medium 30 when the low-speed data is changed from 0 to 1. A dotted line of FIG. 7A shows a case in which the RD value is +1 when the low-speed data is changed from 0 to 1, and a dotted line of FIG. 7B shows a case in which the RD value is −1 when the low-speed data is changed from 0 to 1. As is understood from these diagrams, the RD value is +3 or +1, or −3 or −1 at the boundary between 6 bits and 4 bits in each 8B10B-encoded 10-bit data. RD makes a transition between +5 and −1 or between −5 and +1. While the transition width is increased at the instant when the low-speed data is changed from 0 to 1, the transition width in the other period is the same as that in normal 8B10B encoding. Consecutive 0s or is extend over up to 7 bits. Consecutive 0s or is extending over 7 bits occur in a position including the boundary between 6 bits and 4 bits when the low-speed data is changed from 0 to 1. Although consecutive 0s or is are allowed to extend over up to 5 bits in normal 8B10B encoding, the increase from 5 bits to 7 bits seems to affect the transmission quality to a lesser extent.

As seen above, according to the present embodiment, when encoding high-speed data using 8B10B encoding, low-speed data is incorporated into the high-speed data by changing the encoding rules, for example, by allowing a change in the range of RD or a change in the number of consecutive identical signals. This eliminates the need to separately provide a transmission medium for low-speed data, as well as the need to transmit data in a time-sharing manner. Thus, it is possible to suppress a reduction in the data transmission efficiency while suppressing the equipment cost.

As described above, the receiving circuit 20 detects the changes in the encoding rules and thus detects the low-speed data on the basis of the RD value at the boundary between 6 bits and 4 bits in the 8B10B-encoded data; however, the low-speed data may be detected from different information in the received data. For example, the receiving circuit 20 may detect the changes in the 8B10B encoding rules and thus detect the low-speed data value in accordance with the maximum transition width of RD or the number of consecutive identical symbols in the received data.

Next, the operation when the low-speed data is changed from 1 to 0 will be described. When the low-speed data is changed from 1 to 0, the RD control circuit 12 of the transmission circuit 10 detects that the low-speed data has been changed from 1 to 0. The RD control circuit 12 then notifies the 8B10B encoding circuit 11 that the low-speed data has been changed from 1 to 0.

Thus, if the RD value at the boundary between 6 bits and 4 bits is +1 or −1, the 8B10B encoding circuit 11 inverts RD. If RD is +1, RD of the next pattern is normally 0 or +2; however, a pattern where RD is 0 or −2 is selected as RD of the next pattern due to the inversion of RD. if RD is −1, RD of the next pattern is normally 0 or −2; however, a pattern where RD is 0 or +2 is selected as RD of the next pattern due to the inversion of RD.

By performing this operation, RD is restored to its original state. This is because RD has been inverted due to the change of the low-speed data from 0 to 1 and inverted again due to the change of the low-speed data from 1 to 0. That is, normal 8B10B encoding is restored, and the RD value at the boundary between 6 bits and 4 bits becomes −1 or +1. The inversion of RD is performed only once when the RD value at the boundary between 6 bits and 4 bits is +1 or −1. Note that the inversion of RD is put on hold when the RD value at the boundary between 6 bits and 4 bits is +3 or −3; the inversion of RD is performed only after the RD value becomes +1 or −1 at the boundary between 6 bits and 4 bits in the next 10-bit data. That is, even if the low-speed data is changed from 1 to 0, it may take time until RD is inverted.

The data outputted from the 8B10B encoding circuit 11 is transmitted to the receiving circuit 20 through the parallel/serial conversion circuit 13 and data transmission medium 30 and then inputted to the 8B10B decoding circuit 21 through the serial/parallel conversion circuit 23. The 8B10B decoding circuit 21 outputs the RD value to the RD analysis circuit 22. The RD analysis circuit 22 recognizes that 0 has been transmitted as low-speed data, since the RD value is −1 or +1 at the boundary between 6 bits and 4 bits, and outputs 0 as low-speed data. As described above, even if the low-speed data is changed from 1 to 0, it may take time until RD is inverted. One measure to invert RD earlier is to sufficiently increase the value of the byte number n of the high-speed data that defines 1 bit of the low-speed data.

The 8B10B decoding circuit 21 receives a notification that the low-speed data 0 has been transmitted, from the RD analysis circuit 22, performs normal 8B10B decoding on the high-speed data, and outputs the decoded high-speed data.

Figure 8A:
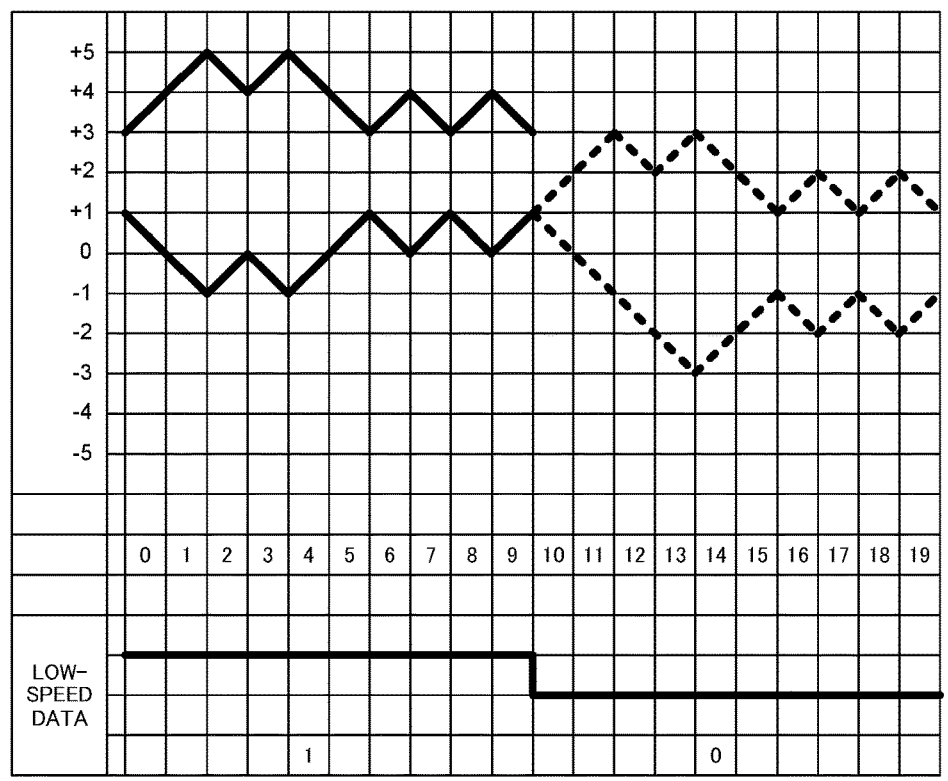
FIG. 8A is a graph showing encoding of transmission data.

FIG. 8A is a graph showing the range of RD in data passing through the data transmission medium 30 when the low-speed data is changed from 1 to 0 and is a graph showing a case in which RD is +1 at the boundary between 6 bits and 4 bits when the low-speed data is changed from 1 to 0. In FIG. 8A, the change range of RD after the change of the low-speed data from 1 to 0 is shown by a dotted line. As is understood from this graph, RD returns to the original 8B10B encoding rules and makes a transition between +3 and −3. Thus, the RD value becomes −1 or +1 at the boundary between 6 bits and 4 bits in the 8B10B-encoded 10-bit data, and consecutive 0s or is are allowed to extend over up to 5 bits.

Figure 8B:
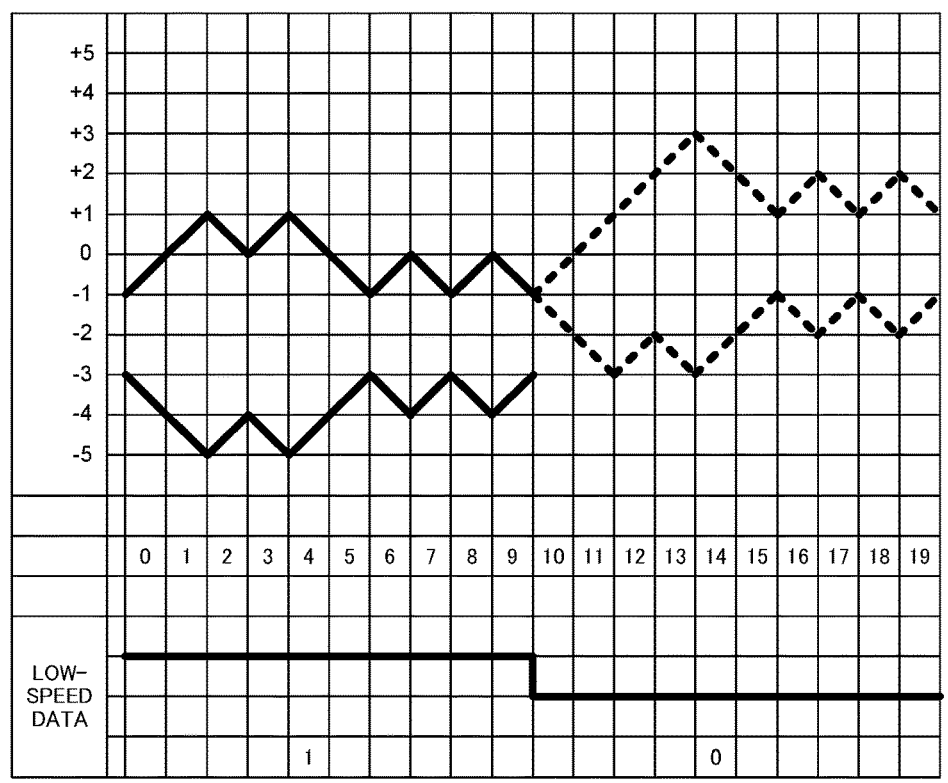
FIG. 8B is a graph showing encoding of transmission data.

FIG. 8B is a graph showing the range of RD in data passing through the data transmission medium 30 when the low-speed data is changed from 1 to 0 and is a graph showing a case in which RD is −1 at the boundary between 6 bits and 4 bits when the low-speed data is changed from −1 to 0. In FIG. 8B, the change range of RD after the change of the low-speed data from 1 to 0 is shown by a dotted line. As is understood from this graph, RD returns to the original 8B10B encoding rules and makes a transition between +3 and −3. Thus, the RD value becomes −1 or +1 at the boundary between 6 bits and 4 bits in the 8B10B-encoded 10-bit data, and consecutive 0s or is are allowed to extend over up to 5 bits.

As seen above, even if the low-speed data is changed from 1 to 0, the low-speed data is incorporated into the high-speed data by making changes to the 8B10B encoding rules of the high-speed data.

In the present embodiment, RD of the 8B10B encoding rules is noted. However, as with RD of the 8B10B encoding rules, a change in information required for encoding or a change in the encoding rules may be associated with the change of the low-speed data. Thus, another type of data such as the low-speed data can be incorporated into one type of data such as the high-speed data. Also, 8B10B encoding need not necessarily be performed. Even if one type of data is encoded using another encoding scheme, another type of data can be incorporated into the one type of data by changing the encoding rules. As described above, the present invention is implemented by improving the existing encoding rules; however, it need not be implemented using the existing encoding rules. For example, a new encoding rule for performing encoding as described above may be generated and implemented.

Second Embodiment

Figure 9:
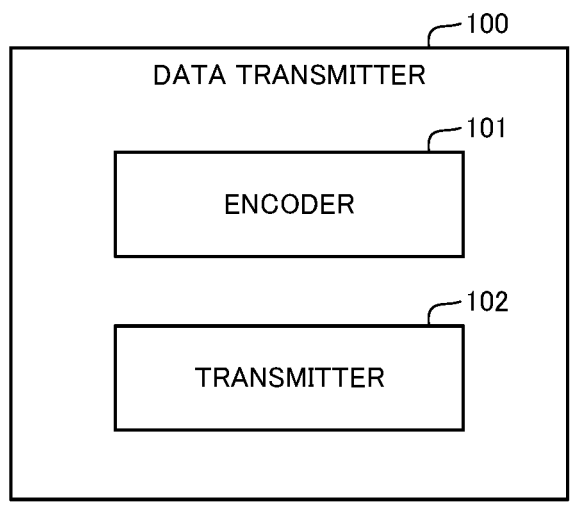
FIG. 9 is a block diagram showing the configuration of a data transmitter according to a second embodiment of the present invention.
Figure 10:
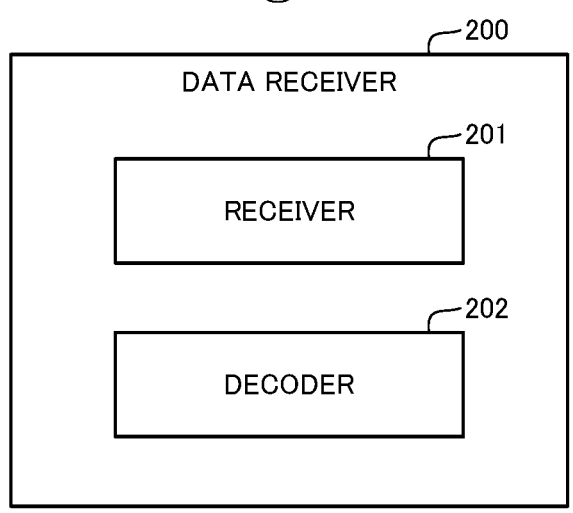
FIG. 10 is a block diagram showing the configuration of a data receiver according to the second embodiment of the present invention.

Next, a second embodiment of the present invention will be described with reference to FIGS. 9, 10. FIGS. 9 and 10 are block diagrams showing the configuration of a data transmitter and a data receiver according to the second embodiment. The data transmitter and data receiver according to the present embodiment represent an outline of the configuration of the transmission circuit 10 and receiving circuit 20 described in the first embodiment.

A data transmitter 100 shown in FIG. 9 includes an encoder 101 that encodes first data to be transmitted, in accordance with an encoding rule and a transmitter 102 that transmits the encoded first data. The transmitter 102 makes a change to the encoding rule, encodes the first data in accordance with the change in the encoding rule, and incorporates second data having content corresponding to the change in the encoding rule into the first data.

A data receiver 200 shown in FIG. 10 includes a receiver 201 that receives first data encoded in accordance with an encoding rule and a decoder 202 that decodes the first data in accordance with the encoding rule. If the first data is encoded in accordance with a change in the encoding rule, the decoder 202 detects the change in the encoding rule by decoding the first data and reads second data having content corresponding to the change in the encoding rule.

The units 101, 102, 201, and 202 included in the devices 100, 200 are constructed by causing arithmetic devices included in the devices 100, 200 to execute programs.

Using the above configuration, the data transmitter 100 makes a change to the encoding rule, encodes first data to be transmitted, in accordance with the change in the encoding rule, incorporates second data having content corresponding to the change in the encoding rule, into the first data, and transmits the encoded first data to the data receiver 200.

The data receiver 200 receives the first data encoded in accordance with the change in the encoding rule and decodes the first data in accordance with the change in the encoding rule. At this time, the data receiver 200 detects the change in the encoding rule and reads the second data having content corresponding to the change in the encoding rule.

Thus, the data transmitter 100 can incorporate the second data corresponding to the change in the encoding rule in encoding the first data. The data receiver 200 can read the second data corresponding to the change in the encoding rule in decoding the first data. Accordingly, the data transmitter 100 can transmit the second data in such a manner that the second data is incorporated in the first data and need not transmit the data in a time-sharing manner. As a result, it is possible to suppress the equipment cost and to suppress a reduction in the data transmission efficiency.

Supplementary Notes

Some or all of the above embodiments can be described as in Supplementary Notes below. Hereafter, there will be outlined the configurations of a data transmitter, data receiver, communication system, data transmission method, data receiving method, data transmission/reception method, and program according to the present invention. However, the present invention is not limited to the configurations below.

Supplementary Note 1

A data transmitter comprising:

an encoder configured to encode first data to be transmitted, in accordance with an encoding rule; and a transmitter configured to transmit the encoded first data, wherein the encoder makes a change to the encoding rule, encodes the first data in accordance with the change in the encoding rule, and incorporates second data having content corresponding to the change in the encoding rule, into the first data.

Supplementary Note 2

The data transmitter according to supplementary note 1, wherein the encoder makes a change to the encoding rule so as to correspond to a change in the content of the second data and encodes the first data in accordance with the change in the encoding rule.

Supplementary Note 3

The data transmitter according to supplementary note 1 or 2, wherein the encoder encodes the first data in accordance with the encoding rule providing that the first data shall be encoded in such a manner that a predetermined or larger number of consecutive identical signals do not occur, as well as incorporates the second data into the first data by making a change to the encoding rule so that the predetermined or larger number of consecutive identical signals is allowed to occur and encoding the first data in accordance with the change in the encoding rule.

Supplementary Note 4

The data transmitter according to any one of supplementary notes 1 to 3, wherein the encoder encodes the first data in accordance with the encoding rule providing that a calculation value calculated in accordance with a predetermined calculation rule on the basis of predetermined symbol data shall fall within a set range, the predetermined symbol data being obtained by converting a predetermined amount of the first data, as well as incorporates the second data into the first data by making a change to the encoding rule so that the calculation value is allowed to fall outside the set range and encoding the first data in accordance with the change in the encoding rule so that the first data is converted into the symbol data.

Supplementary Note 5

The data transmitter according to any one of supplementary notes 1 to 4, wherein the encoder encodes the first data in accordance with the encoding rule providing that symbol data obtained by converting subsequent first data shall be set in accordance with a calculation value calculated in accordance with a predetermined calculation rule on the basis of predetermined symbol data obtained by converting a predetermined amount of the first data, as well as sets the symbol data obtained by converting the subsequent first data, in such a manner that the calculation value is changed so as to correspond to a change in the content of the second data.

Supplementary Note 6

The data transmitter according to any one of supplementary notes 1 to 5, wherein the encoder encodes the first data in accordance with the encoding rule providing that symbol data obtained by converting subsequent first data shall be set in accordance with a value of a running disparity calculated by 8B10B-encoding the first data, as well as sets the symbol data in accordance with a value obtained by reversing a sign of the value of the running disparity, so as to correspond to a change in the content of the second data.

Supplementary Note 7

A data receiver comprising:

a receiver configured to receive first data encoded in accordance with an encoding rule; and a decoder configured to decode the first data in accordance with the encoding rule, wherein if a change is made to the encoding rule in encoding the first data, the decoder detects the change in the encoding rule by decoding the first data and reads second data having content corresponding to the change in the encoding rule.

Supplementary Note 8

The data receiver according to supplementary note 7, wherein the decoder reads a change in the content of the second data corresponding to the change in the encoding rule made in encoding the first data.

Supplementary Note 9

The data receiver according to supplementary note 7 or 8, wherein by decoding the first data in accordance with the encoding rule providing that the first data shall be encoded in such a manner that a predetermined or larger number of consecutive identical signals do not occur, the decoder detects the change in the encoding rule providing that the predetermined or larger number of consecutive identical signals shall be allowed to occur, and reads the content of the second data corresponding to the change in the encoding rule.

Supplementary Note 10

The data receiver according to any one of supplementary notes 7 to 9, wherein by decoding the first data in accordance with the encoding rule providing that a calculation value calculated in accordance with a predetermined calculation rule on the basis of predetermined symbol data shall fall within a set range, the predetermined symbol data being obtained by converting a predetermined amount of the first data, the decoder detects the change in the encoding rule providing that the calculation value shall be allowed to fall outside the set range and reads the content of the second data corresponding to the change in the encoding rule.

Supplementary Note 10.1

A communication system comprising a data transmitter and a data receiver, wherein the data transmitter comprises:

an encoder configured to encode first data to be transmitted, in accordance with an encoding rule; and a transmitter configured to transmit the encoded first data, the encoder makes a change to the encoding rule, encodes the first data in accordance with the change in the encoding rule, and incorporates second data having content corresponding to the change in the encoding rule, into the first data, the data receiver comprises:

a receiver configured to receive the first data encoded in accordance with the encoding rule; and a decoder configured to decode the first data in accordance with the encoding rule, and if a change is made to the encoding rule in encoding the first data, the decoder detects the change in the encoding rule by decoding the first data and reads second data having content corresponding to the change in the encoding rule.

Supplementary Note 11

A data transmission method comprising:

encoding, by a data transmitter, first data to be transmitted, in accordance with an encoding rule; and transmitting, by the data transmitter, the encoded first data, wherein the data transmitter makes a change to the encoding rule, encodes the first data in accordance with the change in the encoding rule, and incorporates second data having content corresponding to the change in the encoding rule, into the first data.

Supplementary Note 12

The data transmission method according to supplementary note 11, wherein the data transmitter makes a change to the encoding rule so as to correspond to a change in the content of the second data and encodes the first data in accordance with the change in the encoding rule.

Supplementary Note 13

The data transmission method according to supplementary note 11 or 12, wherein the data transmitter encodes the first data in accordance with the encoding rule providing that the first data shall be encoded in such a manner that a predetermined or larger number of consecutive identical signals do not occur, as well as incorporates the second data into the first data by making a change to the encoding rule so that the predetermined or larger number of consecutive identical signals is allowed to occur and encoding the first data in accordance with the change in the encoding rule.

Supplementary Note 14

The data transmission method according to any one of supplementary notes 11 to 13, wherein the data transmitter encodes the first data in accordance with the encoding rule providing that a calculation value calculated in accordance with a predetermined calculation rule on the basis of predetermined symbol data shall fall within a set range, the predetermined symbol data being obtained by converting a predetermined amount of the first data, as well as incorporates the second data into the first data by making a change to the encoding rule so that the calculation value is allowed to fall outside the set range and encoding the first data in accordance with the change in the encoding rule so that the first data is converted into the symbol data.

Supplementary Note 15

The data transmission method according to any one of supplementary notes 11 to 14, wherein the data transmitter encodes the first data in accordance with the encoding rule providing that symbol data obtained by converting subsequent first data shall be set in accordance with a calculation value calculated in accordance with a predetermined calculation rule on the basis of predetermined symbol data obtained by converting a predetermined amount of the first data, as well as sets the symbol data obtained by converting the subsequent first data, in such a manner that the calculation value is changed so as to correspond to a change in the content of the second data.

Supplementary Note 16

The data transmission method according to any one of supplementary notes 11 to 15, wherein the data transmitter encodes the first data in accordance with the encoding rule providing that symbol data obtained by converting subsequent first data shall be set in accordance with a value of a running disparity calculated by 8B10B-encoding the first data, as well as sets the symbol data in accordance with a value obtained by reversing a sign of the value of the running disparity, so as to correspond to a change in the content of the second data.

Supplementary Note 17

The data transmission method according to any one of supplementary notes 11 to 16, further comprising:

receiving, by a data receiver, the first data encoded in accordance with the encoding rule; and decoding, by the data receiver, the first data in accordance with the encoding rule, wherein if a change is made to the encoding rule in encoding the first data, the data receiver detects the change in the encoding rule by decoding the first data and reads second data having content corresponding to the change in the encoding rule.

Supplementary Note 18

The data transmission method according to supplementary note 17, wherein the data receiver reads a change in the content of the second data corresponding to the change in the encoding rule made in encoding the first data.

Supplementary Note 19

The data transmission method according to supplementary note 17 or 18, wherein by decoding the first data in accordance with the encoding rule providing that the first data shall be encoded in such a manner that a predetermined or larger number of consecutive identical signals do not occur, the data receiver detects the change in the encoding rule providing that the predetermined or larger number of consecutive identical signals shall be allowed to occur and reads the content of the second data corresponding to the change in the encoding rule.

Supplementary Note 20

The data transmission method according to any one of supplementary notes 17 to 19, wherein by decoding the first data in accordance with the encoding rule providing that a calculation value calculated in accordance with a predetermined calculation rule on the basis of predetermined symbol data shall fall within a set range, the predetermined symbol data being obtained by converting a predetermined amount of the first data, the data receiver detects the change in the encoding rule providing that the calculation value shall be allowed to fall outside the set range and reads the content of the second data corresponding to the change in the encoding rule.

Supplementary Note 21

A data receiving method comprising:

receiving, by a data receiver, first data encoded in accordance with an encoding rule; and decoding, by the data receiver, the first data in accordance with the encoding rule, wherein if a change is made to the encoding rule in encoding the first data, the data receiver detects the change in the encoding rule by decoding the first data and reads second data having content corresponding to the change in the encoding rule.

Supplementary Note 22

A data transmission/reception method performed by a communication system including a data transmitter and a data receiver, the method comprising:

encoding, by a data transmitter, first data to be transmitted, in accordance with an encoding rule;

transmitting, by the data transmitter, the encoded first data, wherein the data transmitter makes a change to the encoding rule, encodes the first data in accordance with the change in the encoding rule, and incorporates second data having content corresponding to the change in the encoding rule, into the first data;

receiving, by a data receiver, the first data encoded in accordance with the encoding rule; and decoding, by the data receiver, the first data in accordance with the encoding rule, wherein if a change is made to the encoding rule in encoding the first data, the data receiver detects the change in the encoding rule by decoding the first data and reads second data having content corresponding to the change in the encoding rule.

Supplementary Note 23

A computer-readable storage medium storing a program for causing a data transmitter to implement:

an encoder configured to encode first data to be transmitted, in accordance with an encoding rule; and a transmitter configured to transmit the encoded first data, wherein the encoder makes a change to the encoding rule, encodes the first data in accordance with the change in the encoding rule, and incorporates second data having content corresponding to the change in the encoding rule, into the first data.

Supplementary Note 24

A computer-readable storage medium storing a program for causing a data receiver to implement:

a receiver configured to receive first data encoded in accordance with an encoding rule; and a decoder configured to decode the first data in accordance with the encoding rule, wherein if a change is made to the encoding rule in encoding the first data, the decoder detects the change in the encoding rule by decoding the first data and reads second data having content corresponding to the change in the encoding rule.

The above programs are stored in a storage device or computer-readable storage medium. For example, the storage medium is a portable medium such as a flexible disk, optical disk, magneto-optical disk, or semiconductor memory.

While the present invention has been described with reference to the embodiments and the like, the present invention is not limited thereto. Various changes understandable by those skilled in the art can be made to the configuration or details of the invention of the present application without departing from the scope of the invention.

DESCRIPTION OF REFERENCE NUMERALS 10 transmission circuit
11 8B10B encoding circuit
12 RD control circuit
13 parallel/serial conversion circuit
20 receiving circuit
21 8B10B decoding circuit
22 RD analysis circuit
23 serial/parallel conversion circuit
30 data transmission medium
100 data transmitter
101 encoder
102 transmitter
200 data receiver
201 receiver
202 decoder

The invention claimed is:

1. A data transmitter comprising:
an encoder configured to:
encode a first portion of first data to be transmitted, in accordance with an encoding rule;
change the encoding rule according to second data to be transmitted; and
encode a second portion of the first data with the changed encoding rule, the change in the encoding rule indicating content of the second data; and
a transmitter configured to transmit the encoded first portion of first data and the encoded second portion of the first data.

2. The data transmitter according to claim 1, wherein
the encoder is further configured to make a change to the encoding rule so as to correspond to a change in the content of the second data and encode the first data in accordance with the change in the encoding rule.

3. The data transmitter according to claim 1, wherein
the encoder is further configured to encode the first data in accordance with the encoding rule providing that the first data shall be encoded in such a manner that a number of consecutive identical signals equal to or larger than a predetermined number do not occur, and incorporate the second data into the first data by making a change to the encoding rule so that the number of consecutive identical signals equal to or larger than the predetermined number is allowed to occur and encoding the first data in accordance with the change in the encoding rule.

4. The data transmitter according to claim 1, wherein the encoder is further configured to encode the first data in accordance with the encoding rule providing that a calculation value calculated in accordance with a predetermined calculation rule based on predetermined symbol data shall fall within a set range, the predetermined symbol data being obtained by converting a predetermined amount of the first data, and incorporate the second data into the first data by making a change to the encoding rule so that the calculation value is allowed to fall outside the set range and encode the first data in accordance with the change in the encoding rule so that the first data is converted into the predetermined symbol data.

5. The data transmitter according to claim 1, wherein the encoder is further configured to encode the first data in accordance with the encoding rule providing that symbol data obtained by converting the second portion of the first data shall be set in accordance with a calculation value calculated in accordance with a predetermined calculation rule based on predetermined symbol data obtained by converting a predetermined amount of the first data, and set the symbol data obtained by converting the second portion of the first data, in such a manner that the calculation value is changed so as to correspond to a change in the content of the second data.

6. The data transmitter according to claim 1, wherein the encoder is further configured to encode the first data in accordance with the encoding rule providing that symbol data obtained by converting the second portion of first data shall be set in accordance with a value of a running disparity calculated by 8B10B-encoding the first data, and set the symbol data in accordance with a value obtained by reversing a sign of the value of the running disparity, so as to correspond to a change in the content of the second data.

7. A data receiver comprising:
a receiver configured to receive a first portion of first data encoded in accordance with an encoding rule; and
a decoder configured to:
decode the first portion of the first data in accordance with the encoding rule;
detect a change in the encoding rule;
decode a second portion of the first data in accordance with the changed encoding rule; and
determine content of second data based on the detection of the change in the encoding rule.

8. The data receiver according to claim 7, wherein the decoder is further configured to determine a change in the content of the second data corresponding to the change in the encoding rule made in encoding the first data.

9. The data receiver according to claim 7, wherein by decoding the first data in accordance with the encoding rule providing that the first data shall be encoded in such a manner that consecutive identical signals equal to or larger than a predetermined number do not occur, the decoder detects the change in the encoding rule providing that the number of consecutive identical signals equal to or larger than the predetermined number shall be allowed to occur and reads the content of the second data corresponding to the change in the encoding rule.

10. The data receiver according to claim 7, wherein by decoding the first data in accordance with the encoding rule providing that a calculation value calculated in accordance with a predetermined calculation rule based on predetermined symbol data shall fall within a set range, the predetermined symbol data being obtained by converting a predetermined amount of the first data, the decoder detects the change in the encoding rule providing that the calculation value shall be allowed to fall outside the set range and reads the content of the second data corresponding to the change in the encoding rule.

11. A data transmission method comprising:
encoding, by a data transmitter, a first portion of first data to be transmitted, in accordance with an encoding rule;
changing, by the data transmitter, the encoding rule according to second data to be transmitted;
encoding, by the data transmitter, a second portion of the first data with the changed encoding rule, the change in the encoding rule indicating content of the second data; and
transmitting, by the data transmitter, the encoded first portion of first data and the encoded second portion of the first data.

12. The data transmission method according to claim 11, wherein
the data transmitter makes a change to the encoding rule so as to correspond to a change in the content of the second data and encodes the first data in accordance with the change in the encoding rule.

13. The data transmission method according to claim 11, wherein
the data transmitter encodes the first data in accordance with the encoding rule providing that the first data shall be encoded in such a manner that a number of consecutive identical signals equal to or larger than a predetermined number do not occur, as well as incorporates the second data into the first data by making a change to the encoding rule so that the number of consecutive identical signals equal to or larger than a predetermined number is allowed to occur and encoding the first data in accordance with the change in the encoding rule.

14. The data transmission method according to claim 11, wherein
the data transmitter encodes the first data in accordance with the encoding rule providing that a calculation value calculated in accordance with a predetermined calculation rule based on predetermined symbol data shall fall within a set range, the predetermined symbol data being obtained by converting a predetermined amount of the first data, as well as incorporates the second data into the first data by making a change to the encoding rule so that the calculation value is allowed to fall outside the set range and encoding the first data in accordance with the change in the encoding rule so that the first data is converted into the predetermined symbol data.

15. The data transmission method according to claim 11, wherein
the data transmitter encodes the first data in accordance with the encoding rule providing that symbol data obtained by converting the second portion of first data shall be set in accordance with a calculation value calculated in accordance with a predetermined calculation rule based on predetermined symbol data obtained by converting a predetermined amount of the first data, and sets the symbol data obtained by converting the second portion of the first data, in such a manner that the calculation value is changed so as to correspond to a change in the content of the second data.

16. The data transmission method according to claim 11, wherein the data transmitter encodes the first data in accordance with the encoding rule providing that symbol data obtained by converting the second portion of the first data shall be set in accordance with a value of a running disparity calculated by 8B10B-encoding the first data, as well as sets the symbol data in accordance with a value obtained by reversing a sign of the value of the running disparity, so as to correspond to a change in the content of the second data.

17. The data transmission method according to claim 11, further comprising:

receiving, by a data receiver, the first portion of the first data encoded in accordance with the encoding rule; and decoding, by the data receiver, the first portion of the first data in accordance with the encoding rule;

detecting a change in the encoding rule;

decoding a second portion of the first data in accordance with the changed encoding rule; and determining content of second data based on the detection of the change in the encoding rule.

18. The data transmission method according to claim 17, wherein the data receiver reads a change in the content of the second data corresponding to the change in the encoding rule made in encoding the first data.

19. The data transmission method according to claim 17, wherein by decoding the first data in accordance with the encoding rule providing that the first data shall be encoded in such a manner that a number of consecutive identical signals equal to or larger than a predetermined number do not occur, the data receiver detects the change in the encoding rule providing that the consecutive identical signals equal to or larger than a predetermined number shall be allowed to occur and reads the content of the second data corresponding to the change in the encoding rule.

20. The data transmission method according to claim 17, wherein by decoding the first data in accordance with the encoding rule providing that a calculation value calculated in accordance with a predetermined calculation rule based on predetermined symbol data shall fall within a set range, the predetermined symbol data being obtained by converting a predetermined amount of the first data, the data receiver detects the change in the encoding rule providing that the calculation value shall be allowed to fall outside the set range and reads the content of the second data corresponding to the change in the encoding rule.

* * * * *